US006960526B1

(12) United States Patent
Shah

(10) Patent No.: US 6,960,526 B1
(45) Date of Patent: Nov. 1, 2005

(54) METHOD OF FABRICATING SUB-100 NANOMETER FIELD EMITTER TIPS COMPRISING GROUP III-NITRIDE SEMICONDUCTORS

(75) Inventor: Pankaj B. Shah, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 69 days.

(21) Appl. No.: 10/682,486

(22) Filed: Oct. 10, 2003

(51) Int. Cl.[7] .................... H01L 21/302; H01L 21/416
(52) U.S. Cl. ..................... 438/688; 438/689; 438/706; 438/709; 438/718
(58) Field of Search ................................ 438/689, 706, 438/708–712, 718

(56) References Cited

U.S. PATENT DOCUMENTS

| | | | | |
|---|---|---|---|---|
| 5,536,193 | A | 7/1996 | Kumar | |
| 5,713,775 | A | 2/1998 | Geis et al. | |
| 5,990,604 | A | 11/1999 | Geis et al. | |
| 6,113,451 | A | 9/2000 | Hobart et al. | |
| 6,218,771 | B1 | 4/2001 | Berishev et al. | |
| 6,376,339 | B2 | 4/2002 | Linthicum et al. | |
| 6,462,355 | B1 | 10/2002 | Linthicum et al. | |
| 2004/0189173 | A1 * | 9/2004 | Chowdhury et al. | 313/309 |
| 2005/0007670 | A1 * | 1/2005 | Jiang et al. | 359/626 |

OTHER PUBLICATIONS

Sowers, et al., "Thin films of aluminum nitride and aluminum gallium nitride for cold cathode applications," Appl. Phys. Lett., Oct. 20, 1997, pp. 2289-2291, vol. 71, No. 16.
Zheleva, et al., "Dislocation density reduction via lateral epitaxy in selectively grown GaN structures," Appl. Phys. Lett., Oct. 27, 1997, pp. 2472-2474, vol. 71, No. 17.
Underwood, et al., "GaN field emitter array diode with integrated anode", J. Vac. Sci. Technol. B., Mar./Apr. 1998, pp. 822-825, vol. 16, No. 2.
Kozawa, et al., "Field emission study of gated GaN and $Al_{0.1}Ga_{0.9}N$/GaN pyramidal field emitter arrays," Appl. Phys. Lett., Nov. 22, 1999, pp. 3330-3332, vol. 75, No. 21.
Kuball, et al., "Focused Ion Beam Etching of Nanometer-Size GaN/AlGaN Device Structures and Their Optical Characterization by Micro-Photoluminescence/Raman Mapping," MRS Interent J. Nitride Semicond. Res., 2000, vol. 5S1 , Art. W12.3.
Günther, et al., "Comparison of field emission from diamond and AIN coated Si Tips," EURO FE. Sep. 25-29, 2000, Segovia-Spain.

(Continued)

*Primary Examiner*—Thanh Nguyen
(74) *Attorney, Agent, or Firm*—Edward L. Stolarun

(57) ABSTRACT

A method of producing a field emission device includes laying a group III-nitride semiconductor layer over a substrate, placing a photoresist mask over the group III-nitride semiconductor layer, patterning a generally circular grid in the photoresist mask and the group III-nitride semiconductor layer, and forming the group III-nitride semiconductor layer into generally pointed tips using an inductively coupled plasma dry etching process, wherein the group III-nitride semiconductor layer comprises a group III-nitride semiconductor material having a low positive electron affinity or a even a negative electron affinity, wherein the inductively coupled plasma dry etching process selectively creates an anisotropic deep etch in the group III-nitride semiconductor layer, and wherein the inductively coupled plasma dry etching process creates an isotropic etch in the group III-nitride semiconductor layer. Preferably, the photoresist layer is approximately 1.7 microns in thickness, and the fabricated tips have a radius of curvature of less than 100 nanometers.

18 Claims, 4 Drawing Sheets

OTHER PUBLICATIONS

Kasu, et al., "Spontaneous ridge-structure formation and large field emission of heavily Si-doped AIN," Appl. Phys. Lett., Mar. 26, 2001, pp. 1835-1837, vol. 78, No. 13.

Sugino, et al., "Field emission from GaN surfaces roughened by hydrogen plasma treatment," Appl. Phys. Lett., May 21, 2001, pp. 3229-3231, vol. 78, No. 21.

Kasu, et al., "Field-emission characteristics and large current density of heavily Si-doped AIN and $Al_xGa_{1-x}N$ (0.38 $\leq x <$ 1)," Appl. Phys. Lett., Nov. 26, 2001, pp. 3642-3644, vol. 79, No. 22.

Tondare, et al., "Field emission from open ended aluminum nitride nanotubes," Appl. Phys. Lett., Jun. 24, 2002, pp. 4813-4815, vol. 80, No. 25.

She, et al., "Silicon tip arrays with ultrathin amorphous diamond apexes," Appl. Phys. Lett., Nov. 25, 2002, pp. 4257-4259, vol. 81, No. 22.

* cited by examiner

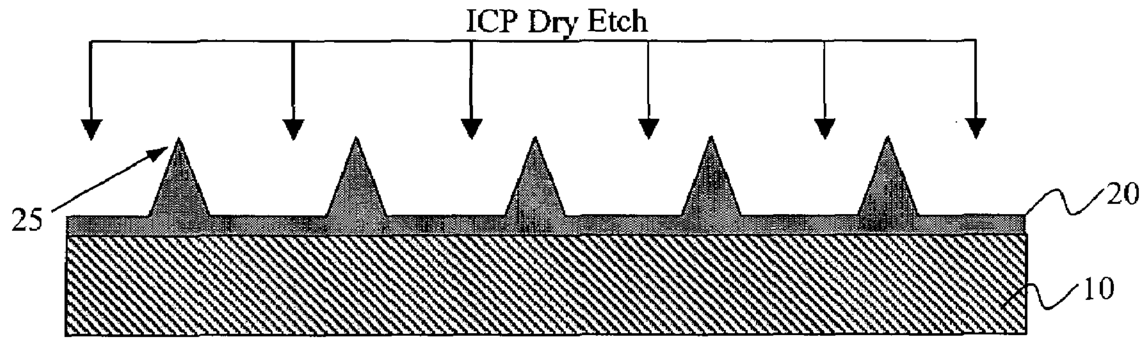
Figure 6
Figure 7
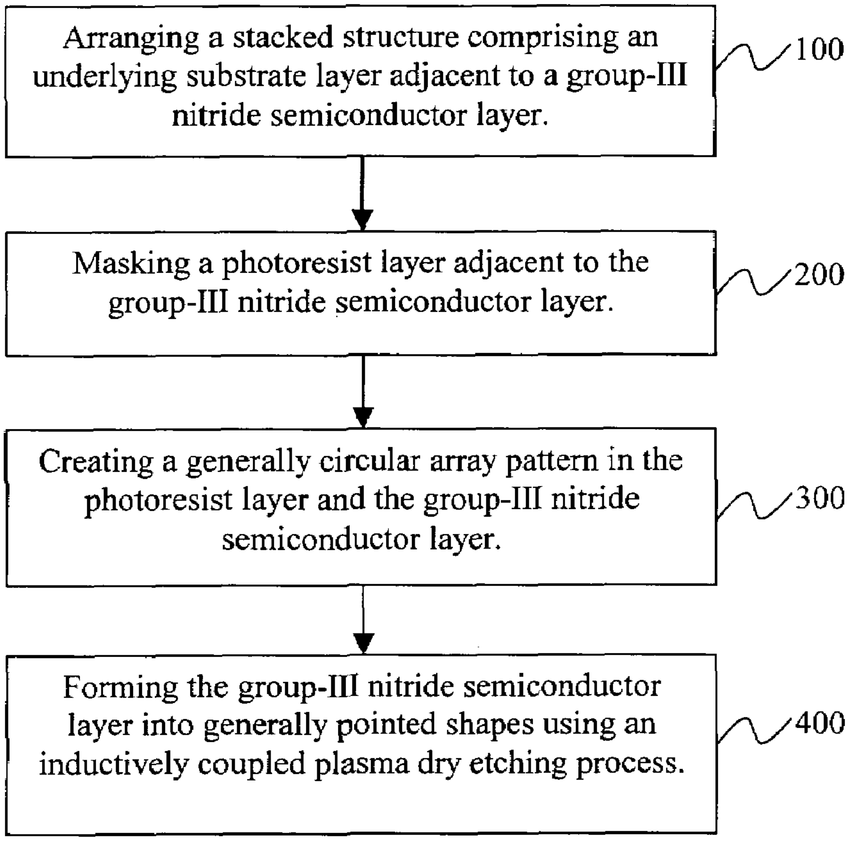

METHOD OF FABRICATING SUB-100 NANOMETER FIELD EMITTER TIPS COMPRISING GROUP III-NITRIDE SEMICONDUCTORS

GOVERNMENT INTEREST

The invention described herein may be manufactured, used, and/or licensed by or for the United States Government.

BACKGROUND OF THE INVENTION

1. Field of the Invention

The present invention generally relates to methods of manufacturing field emitters, and more particularly to a method of fabricating a sub-100 nanometer field emitter tip out of group III-nitride semiconductors for use in vacuum microelectronic devices.

2. Description of the Related Art

The quantum-mechanical phenomenon known as field emission, otherwise referred to as cold emission, occurs when electrons tunnel through an energy barrier at an emitter surface/vacuum interface and through a vacuum subjected to an applied electric field. Typically, the emitter surface is a metal or semiconductor material. This field emission of electrons provides a cold cathode for use in flat panel displays and other vacuum microelectronic devices and applications.

The electron affinity of a particular material (emitter surface material) affects the level of the barrier that the electrons must overcome. While most materials have a large positive electron affinity, some materials have a low or even negative electron affinity. For example, group III-nitride semiconductor materials possess very low electron affinity.

A field emitter's geometry greatly affects its emission characteristics; that is the emission of electrons from one solid material to another. In practice, it has been discovered that field emission is most easily obtained from pointed shapes, such as pointed needles or tips having smoothed hemispherically-contoured ends. The cone shape cathode leads to an increased electric field strength above the cathode relative to the electric field strength at the cathode's surface. With an applied bias, the potential barrier is then sufficiently reduced for electrons to tunnel through leading to a current. These cone shaped tips are referred to as Spindt cathodes.

Field emitter tips are usually fabricated in one of two ways. In a first conventional approach, sequential anisotropic or isotropic etching techniques are used to form sharp tip ends for field emitters. In a second conventional approach, material growth or deposition techniques are used to form structures with submicron scale emission tips. However, the conventional approaches have yet to provide an etch technique for producing field emitter tips from group III-nitride semiconductor materials. Moreover, other shortcomings of the conventional approaches are that the growth techniques are not well developed and have not shown to produce successful Spindt-type group III-nitride field emitter tips with a tip radius near 100 nm.

For high-power and high-frequency applications such as radar, electronic warfare, and space-based communications, vacuum tubes were the conventional preferred devices. However, as the need for even smaller devices becomes prevalent to satisfy the needs of energy efficiency, greater system reliability, and cost efficiency, such vacuum tubes are no longer preferable due to their excessive size, cost, fabrication complexities, and general inapplicability in other applications.

Therefore, there remains a need for an improved process of fabricating a sub-100 nanometer field emitter tip out of group III-nitride semiconductors for use in vacuum microelectronic devices, which overcome the deficiencies of the conventional approaches and result in higher quality field emitter tips.

SUMMARY OF INVENTION

In view of the foregoing, an embodiment of the invention provides a method for fabricating a field emitter tip, wherein the method comprises positioning a group III-nitride semiconductor layer over a substrate, patterning the group III-nitride semiconductor layer using a photoresist masked array, and shaping the group III-nitride semiconductor layer into a field emitter tip using an inductively coupled plasma (ICP) dry etching process, wherein the inductively coupled plasma dry etching process selectively creates an anisotropic deep etch in the group III-nitride semiconductor layer, and wherein the inductively coupled plasma dry etching process creates an isotropic etch in the group III-nitride semiconductor layer creating generally pointed ends on the group III-nitride semiconductor layer. Specifically, the inductively coupled plasma dry etching process creates an anisotropic deep etch in the group III-nitride semiconductor layer followed by an isotropic etch in the group III-nitride semiconductor layer, which creates generally pointed ends on the group III-nitride semiconductor layer.

The group III-nitride semiconductor layer comprises any of gallium nitride, aluminum nitride, aluminum gallium nitride, boron nitride, indium nitride, aluminum indium nitride, aluminum indium gallium nitride, gallium indium nitride, diamond, and other wide bandgap semiconductors. Preferably, the group III-nitride semiconductor layer exhibits a small or even a negative electron affinity. Preferably, the inductively coupled plasma dry etching process comprises a generally four-step etch process. Moreover, preferably the photoresist layer is approximately 1.7 microns in thickness, and the generally pointed shapes each have a radius of curvature of less than 100 nanometers. Also, the inductively coupled plasma dry etching process is performed using gases comprising HBr, $SF_6$, $Cl_2$, and $BCl_3$.

The invention achieves several advantages over conventional fabrication methods discussed above. For example one advantage of the invention's cost effective method for fabricating field emitter tips, such as gallium nitride field emitter tips is that it allows more dense arrays to be created. The method discussed in this invention is more amenable to industry than conventional approaches because the ICP etch tool is already in use in many semiconductor device fabrication facilities as are the gases used for the fabrication of the tips themselves. Moreover, less processing steps and masks are required for the method to be practiced than in conventional methods. Also, faster production of the tips is possible with the invention compared to the conventional methods. Additionally, smaller tip sizes leading to higher power handling is possible with the invention over conventional methods. Furthermore, more geometrically complex devices can be fabricated more easily.

Other advantages of the invention are that it solves several problems, which currently plague the field emitter production industry, and provides the industry with a fast, robust, and cost effective technique for producing gallium nitride or other group III-nitride semiconductor field emitters (such as aluminum nitride field emitters). For example, through its unique methodology in fabrication of the field emitters, vacuum microelectronic devices with the capability of vacuum tubes will be available with the added benefit of faster turn-on because field emitters do not have to be warmed up as vacuum tubes do. Furthermore, the invention achieves device miniaturization and extends the device lifetime due to the materials used in the fabrication of the emitter tips as well as the manner in which the tips are produced. Also, the invention eliminates the need for vacuum tubes, which are heavy and can take a large amount of space that vacuum microelectronic devices do not need. Moreover, the materials used for the field emitter device provided by the invention, and the technique used to produce them create devices that last longer than conventional vacuum tubes.

Additionally, the invention is advantageous because it extends to several different applications. In fact, besides the applications of radar, electronic warfare, and space based communications, other applications are also possible with vacuum microelectronic devices made from group-III nitride semiconductors as provided by the invention such as hall thrusters and ion thrusters for space applications.

BRIEF DESCRIPTION OF THE DRAWINGS

The invention will be better understood from the following detailed description of a preferred embodiment of the invention with reference to the drawings, in which:

FIG. 4(*b*) is top view schematic diagram illustrating an intermediate step in the fabrication of a field emitter structure according to the invention;

FIG. 6 is a cross-sectional schematic diagram illustrating a field emitter structure according to the invention;

FIG. 7 is a flow diagram illustrating a preferred method of the invention.

DETAILED DESCRIPTION OF PREFERRED EMBODIMENTS OF THE INVENTION

Figure 1:
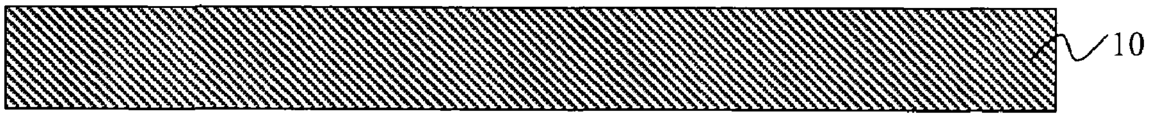
FIG. 1 is a cross-sectional schematic diagram illustrating an intermediate step in the fabrication of a field emitter structure according to the invention.

As previously mentioned, there is a need for an improved process of fabricating a sub-100 nanometer field emitter tip out of group III-nitride semiconductors for use in vacuum microelectronic devices, which overcome the deficiencies of the conventional approaches and results in higher quality field emitter tips. Referring now to the drawings, and more particularly to FIGS. 1 through 8, there are shown preferred embodiments of the invention.

An embodiment of the invention provides an improvement to conventional field emitter fabrication techniques. The invention is a cost effective technique for producing field emitter tips made of group III-nitride semiconductors such as gallium nitride by using a dry etching (reactive ion etching) technique such as an inductive coupled plasma etching technique rather than a conventional growth or material deposition technique. These tips have a radius of curvature of less than 100 nm for use in vacuum microelectronic devices. The procedure used to fabricate these tips is illustrated in FIGS. 1 through 6, with an overall flowchart of the process illustrated in FIG. 7.

Figure 2:
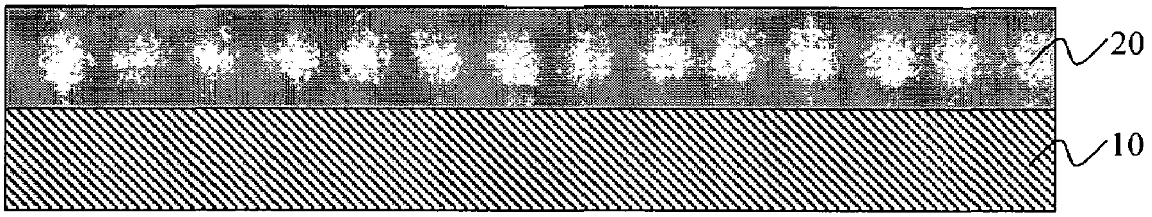
FIG. 2 is a cross-sectional schematic diagram illustrating an intermediate step in the fabrication of a field emitter structure according to the invention.

As illustrated in FIG. 1, the process begins with a substrate 10. The substrate 10 may comprise silicon, glass, quartz, or other metals known in the art, which provide a base whereupon areas of emission can be fabricated. Next, as shown in FIG. 2, a layer of group III-nitride semiconductor material 20 such as gallium nitride or aluminum nitride is deposited on the substrate 10. Many different materials may be used for semiconductor layer 20, such as other group III-nitride semiconductors (aluminum gallium nitride with different percentages of aluminum, boron nitride, indium nitride, indium gallium nitride, indium aluminum nitride, aluminum indium gallium nitride, diamond, and other wide band gap semiconductors). The advantage of gallium nitride in these applications is it has a very small electron affinity. Moreover, aluminum nitride is even more preferable because it tends to exhibit a negative electron affinity. For example, $Al_xGa_{(1-x)}N$ for $1>x>0.75$, has an electron affinity less than zero.

Figure 3:
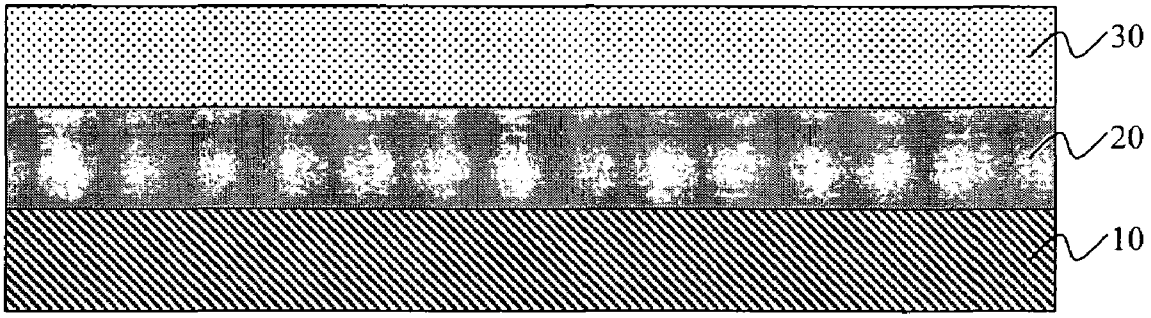
FIG. 3 is a cross-sectional schematic diagram illustrating an intermediate step in the fabrication of a field emitter structure according to the invention.

Thereafter, a photoresist layer 30 preferably approximately 1.7 microns thick is deposited over the group-III nitride semiconductor layer 20, which is illustrated in FIG. 3. Any photoresist 30 typically used in the art may be used in the process. However, the photoresist 30 must be capable of withstanding the etching process. Alternatively, a metal mask such as a nickel or chrome mask may be used instead of the photoresist layer 30.

Figure 4A:
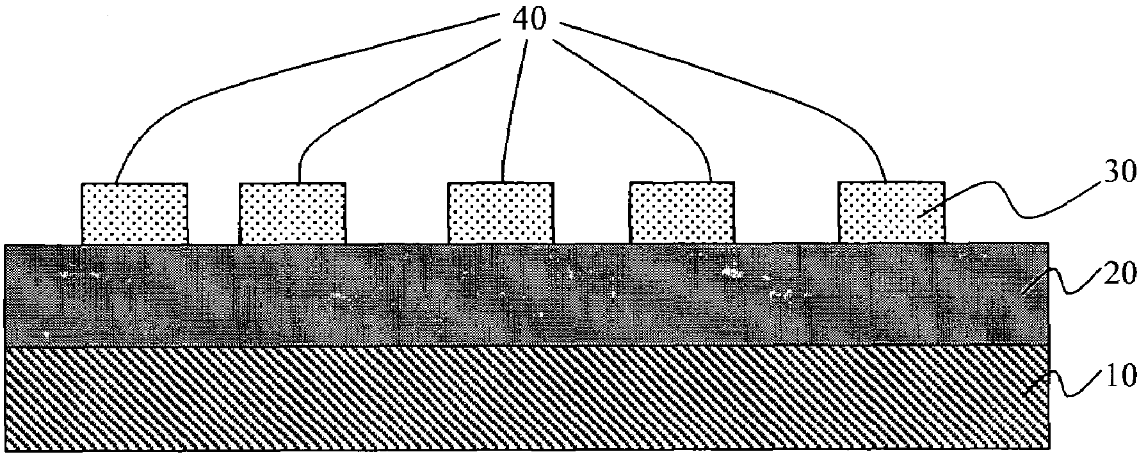
FIG. 4(*a*) is a cross-sectional schematic diagram illustrating an intermediate step in the fabrication of a field emitter structure according to the invention.
Figure 4B:
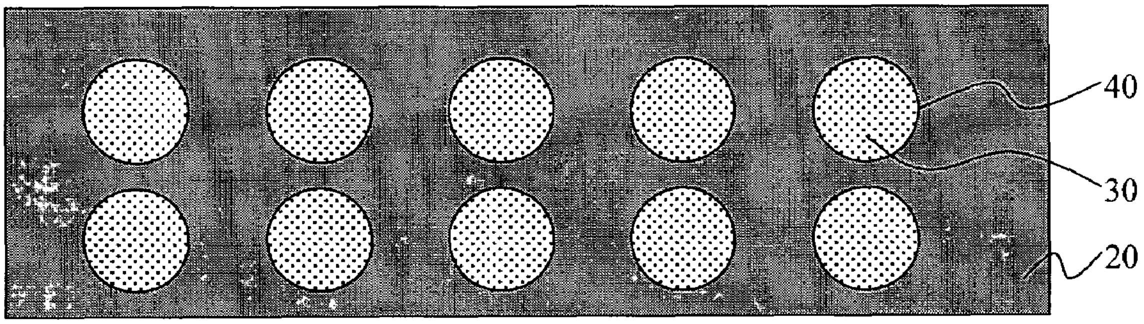

Next, as shown in FIG. 4(*a*), the photoresist layer 30 is patterned with a series of circular patterns 40 approximately 2 microns in diameter and spaced in an array pattern that the desired tips should follow, which is further illustrated in FIG. 4(*b*). The patterning is performed using photolithography, where a portion of the photoresist 30 is exposed to UV light and then developed to remove the exposed region. During exposure, a chrome mask (not shown) is used to shield the UV light from some regions of the photoresist, though any mask used conventionally in lithography could be used.

Figure 5:
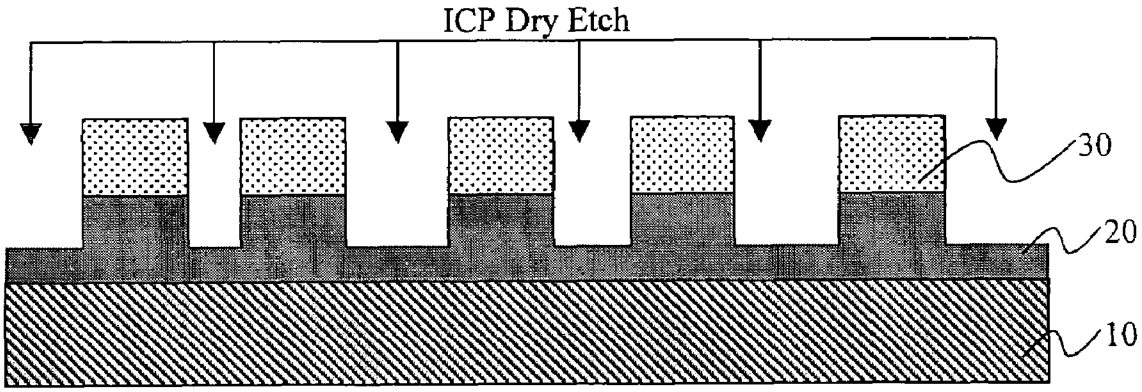
FIG. 5 is a cross-sectional schematic diagram illustrating an intermediate step in the fabrication of a field emitter structure according to the invention.

Then, as shown in FIG. 5, an inductively coupled plasma (ICP) dry etch system is used to obtain an anisotropic deep etch that selectively etches the semiconductor material 20 rather than the photoresist mask 30. Upon completion of this step, an inductively coupled plasma dry etch system is once again used to obtain an isotropic etch that creates a point or tip 25 by etching away the photoresist mask 30 and the gallium nitride layer 20 underneath the photoresist 30, as shown in FIG. 6. Preferably, this is accomplished by reducing the substrate bias and increasing the ICP plasma generating power. Then, any additional photoresist remaining on the gallium nitride is removed. Finally, subsequent process steps are continued (not shown) to produce a complete vacuum microelectronic device.

The inventive process is a multi-step anisotropic etch technique. Conventional approaches have typically used a reactive ion etch rather than an inductively coupled plasma reactive ion etch system (ICP-RIE). However, an ICP-RIE system is preferable for field emitter tip production because it allows one to independently change the concentration of the reactive species, and the energy with which the reactive species bombard the surface. Moreover, conventional approaches have not used the gases HBr and $SF_6$ together with $Cl_2$ and $BCl_3$ to etch GaN. Moreover, while ICP is known to give an anisotropic etch, the invention uses ICP for both anisotropic and isotropic etches.

Other embodiments of the invention include variations where the gas concentrations may be slightly changed. Moreover, the various pressures may be changed in the different processing steps.

Thus, the overall process as illustrated in the flowchart of FIG. 7 provides a method of making a field emitter tip for use in a vacuum microelectronic device, wherein the method comprises arranging 100 a stacked structure comprising an underlying substrate layer 10 adjacent to a group III-nitride semiconductor layer 20; masking 200 a photoresist layer 30 adjacent to the group III-nitride semiconductor layer 20; creating 300 a generally circular array pattern or grid 40 in the photoresist layer 30 and the group III-nitride semiconductor layer 20; and forming 400 the group III-nitride semiconductor layer 20 into generally pointed shapes or tips 25 using an inductively coupled plasma dry etching process.

In practice the inductively coupled plasma dry etching process preferably comprises a four-step etching process each having a its own parameters of time, temperature, exposed gases, and amount of ICP power used for the etch. Moreover, the group III-nitride semiconductor layer comprises any of gallium nitride, aluminum nitride, aluminum gallium nitride, boron nitride, indium nitride, aluminum indium nitride, aluminum indium gallium nitride, gallium indium nitride, diamond, and other wide bandgap semiconductors.

Due to the carefully selected parameters used in the etch process of the ICP etching system as well as selecting a group III-nitride semiconductor comprising material having a very low positive electron affinity, or even a negative electron affinity (i.e., $Al_xGa_{(1-x)}N$ for 1>x>0.75, has an electron affinity less than zero), the resulting field emission devices (tips) have a radius of curvature of less than 100 nanometers.

Figure 8:
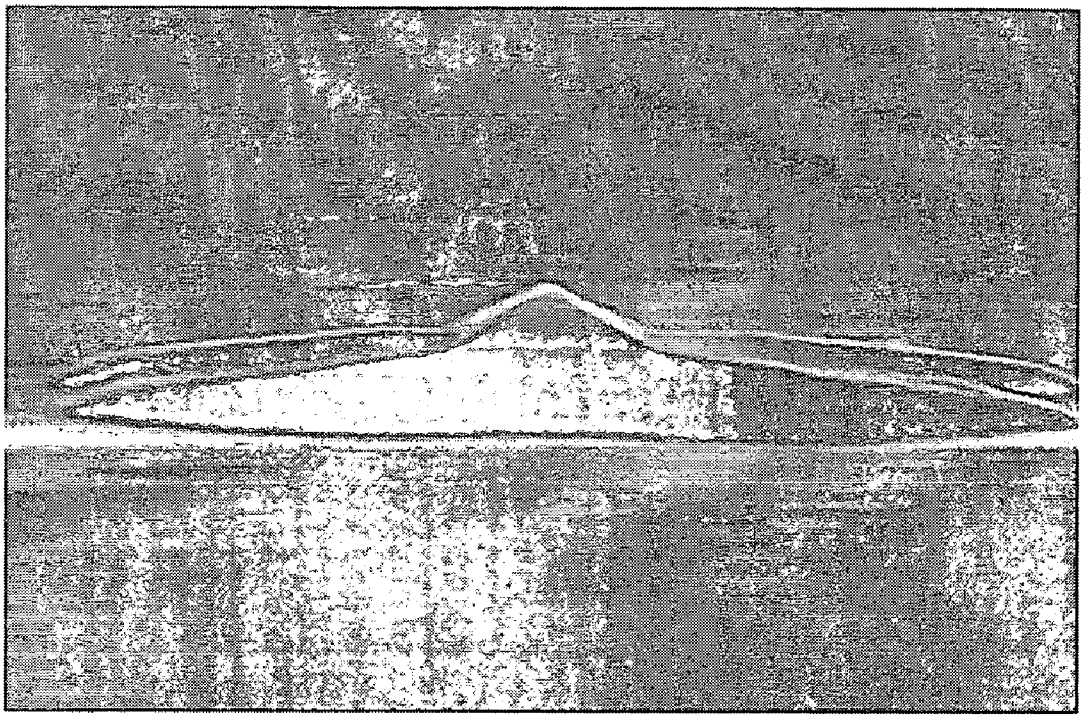
FIG. 8 is a scanning electron microscopy representation illustrating a field emitter structure according to the invention.

FIG. 8 shows a gallium nitride field emitter tip, under scanning electron microscopic resolution, created in an experiment using an ICP etch as provided by the invention. As mentioned, the conventional processes fabricate these types of tips either by growing the material (such as gallium nitride or aluminum nitride) in such a manner that leads to automatic tip creation, or by using material deposition and positioning techniques to create pointed structures without any demonstrated success at achieving a tip radius of curvature close to 100 nm. Conversely, the invention uses an etching process to fabricate field emitter tips. Preferably, the four-step inductive coupled plasma etch as provided by the invention is performed using the following parameters listed in Table 1 for each etching process.

TABLE 1

| ICP Etching Parameters | |
|---|---|
| Etch 1: | 240 seconds, 4 mTorr pressure, 25° Celsius temperature, 200 W chuck power (leading to 420 V DC bias), 500 W ICP power, 14 sccm $Cl_2$ gas flow, 10 sccm $BCl_3$ gas flow. |
| Etch 2: | 20 seconds, 6 mTorr pressure, 25° Celsius temperature, 75 W chuck power (leading to 150 V DC bias), 1000 W ICP power, 10 sccm $Cl_2$ gas flow, 10 sccm $BCl_3$ gas flow, 2 sccm $SF_6$, 2 sccm HBr. |
| Etch 3: | 20 seconds, 6 mTorr pressure, 25° Celsius temperature, 75 W chuck power (leading to 152 V DC bias), 1000 W ICP power, 10 sccm $Cl_2$ gas flow, 10 sccm $BCl_3$ gas flow, 4 sccm $SF_6$, 4 sccm HBr. |
| Etch 4: | 20 seconds, 6 mTorr pressure, 25° Celsius temperature, 75 W chuck power (leading to 153 V DC bias), 1000 W ICP power, 10 sccm $Cl_2$ gas flow, 10 sccm $BCl_3$ gas flow, 8 sccm SF6, 8 sccm HBr. |

An ICP-RIE system, as used with the invention, comprises a metal chamber that has a metal coil around the top of the chamber, wherein the metal coil is supplied with RF power. This coil induces a magnetic field in the chamber that generates a plasma from the gases entering the chamber. The RF bias at the chuck causes this plasma to energetically bombard the material to be etched. Therefore, the etching is due to both the reactive ability of the high-energy plasma and the bombardment of the ions in this plasma on the material to be etched.

As mentioned, the invention achieves several advantages over conventional fabrication methods discussed above. For example one advantage of the invention's cost effective method for fabricating field emitter tips, such as gallium nitride field emitter tips is that it allows more dense arrays to be created. The method discussed in this invention is more amenable to industry than conventional approaches because the ICP etch tool is already in use in many semiconductor device fabrication facilities as are the gases used for the fabrication of the tips themselves. Moreover, less processing steps and masks are required for the method to be practiced than in conventional methods. Also, faster production of the tips is possible with the invention compared to the conventional methods. Additionally, smaller tip sizes leading to higher power handling is possible with the invention over conventional methods. Furthermore, more geometrically complex devices can be fabricated more easily.

Other advantages of the invention are that it solves several problems, which currently plague the high power/high frequency industry, and provides the industry with a fast, robust, and cost effective technique for producing gallium nitride or other group III-nitride semiconductor field emitters (such as aluminum nitride field emitters). For example, through its unique methodology in fabrication of the field emitters, vacuum microelectronic devices with the capability of vacuum tubes will be available with the added benefit of faster turn-on because field emitters do not have to be warmed up as vacuum tubes do. Furthermore, the invention achieves device miniaturization and extends the device lifetime due to the materials used in the fabrication of the emitter tips as well as the manner in which the tips are produced. Also, the invention eliminates the need for vacuum tubes in certain applications, which are heavy and can take a large amount of space that vacuum microelectronic devices do not need. Moreover, the materials used for the field emitter device provided by the invention, and the technique used to produce them create devices that last longer than conventional vacuum tubes.

Additionally, the invention is advantageous because it extends to several different applications. In fact, besides the applications of radar, electronic warfare, and space based communications, other applications are also possible with vacuum microelectronic devices made from group-III nitride semiconductors as provided by the invention such as hall thrusters and ion thrusters for space applications.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

What is claimed is:

1. A method for fabricating a field emitter tip, said method comprising:

positioning a group III-nitride semiconductor over a substrate;

patterning said group III-nitride semiconductor using a masked array; and shaping said group III-nitride semiconductor into said field emitter tip using a plasma dry etching process wherein said plasma dry etching process creates an anisotropic deep etch in said group III-nitride semiconductor followed by an isotropic etch in said group III-nitride semiconductor creating generally pointed ends on said group III-nitride semiconductor.

2. The method of claim 1, wherein the step of positioning uses a photoresist masked array; and the step of shaping uses an inductively coupled plasma dry etching process.

3. The method of claim 1, wherein said group III-nitride semiconductor comprises any of gallium nitride, aluminum nitride, aluminum gallium nitride, aluminum indium nitride, aluminum indium gallium nitride, gallium indium nitride, boron nitride, diamond, and other wide bandgap semiconductors.

4. The method of claim 2, wherein said inductively coupled plasma dry etching process comprises a four-step etch process.

5. The method of claim 2, wherein said photoresist masked array is approximately 1.7 microns in thickness.

6. The method of claim 1, wherein said tip has a radius of curvature of less than 100 nanometer.

7. The method of claim 2, wherein said inductively coupled plasma dry etching process is performed using gases comprising HBr, $SF_6$, $Cl_2$, and $BCl_3$.

8. A method of making a field emitter tip for use in a vacuum microelectronic device, said method comprising:

arranging a stacked structure comprising an underlying substrate layer adjacent to a group-III nitride layer;

masking a photoresist layer adjacent said group-III nitride layer;

creating a generally circular array pattern in said photoresist layer and said group-III nitride layer; and forming said group-III nitride layer into generally pointed shapes using an inductively coupled plasma dry etching process wherein said inductively coupled plasma dry etching process creates an anisotropic deep etch in said group III-nitride layer followed by an isotropic etch in said group III-nitride layer creating generally pointed shapes on said group III-nitride layer.

9. The method of claim 8, wherein said group-III nitride layer comprises any of gallium nitride, aluminum nitride, aluminum gallium nitride, aluminum indium nitride, aluminum indium gallium nitride, gallium indium nitride, boron nitride, diamond, and other wide bandgap semiconductors.

10. The method of claim 8, wherein said photoresist layer is approximately 1.7 microns in thickness.

11. The method of claim 8, wherein said generally pointed shapes each have a radius of curvature of less than 100 nanometers.

12. The method of claim 8, wherein said inductively coupled plasma dry etching process is performed using gases comprising HBr, $SF_6$, $Cl_2$, and $BCl_3$.

13. The method of claim 8, wherein said group-III nitride layer comprises a material having a negative electron affinity.

14. A method of producing a field emission device, said method comprising:

laying a group III-nitride semiconductor layer over a substrate layer;

placing a mask over said group III-nitride semiconductor layer;

patterning a generally circular grid in said mask and said group III-nitride semiconductor layer;

forming said group III-nitride semiconductor layer into generally pointed tips using an inductively coupled plasma dry etching process wherein said inductively coupled plasma etching process creates an anisotropic deep etch in said group III-nitride semiconductor layer followed by an isotropic etch in said group III-nitride semiconductor layer creating generally pointed tips on said group III-nitride semiconductor layer; and wherein said group III-nitride semiconductor layer comprises a group III-nitride semiconductor material having a negative electron affinity.

15. The method of claim 14, wherein said photoresist layer is approximately 1.7 microns in thickness.

16. The method of claim 14, wherein said tips have a radius of curvature of less than 100 nanometers.

17. The method of claim 14, wherein said mask comprises any of a photoresist mask, a nickel mask, and a chrome mask.

18. The method of claim 14, wherein said inductively coupled plasma dry etching process is performed using gases comprising HBr, $SF_6$, $Cl_2$, and $BCl_3$.

* * * * *